United States Patent [19]

Adams et al.

[11] Patent Number: 5,101,149

[45] Date of Patent: Mar. 31, 1992

[54] MODIFIABLE IC BOARD

[75] Inventors: Leon K. Adams; Rassoul R. Aleshi, both of San Jose, Calif.

[73] Assignee: National Semiconductor Corporation, Santa Clara, Calif.

[21] Appl. No.: 381,565

[22] Filed: Jul. 18, 1989

[51] Int. Cl.⁵ .............................................. G01R 31/02
[52] U.S. Cl. ................... 324/73.1; 324/158 R; 324/158 F
[58] Field of Search ............ 324/158 F, 178 P, 73 PC, 324/73 AT, 158 R, 73.1, 500, 537, 538; 361/414, 309

[56] References Cited

U.S. PATENT DOCUMENTS

| | | | |
|---|---|---|---|
| 3,830,956 | 8/1974 | Wootton et al. | 324/73 PC |
| 4,175,253 | 11/1979 | Pitegoff | 324/73 PC |
| 4,577,149 | 3/1986 | Zbinden | 324/73 PC |
| 4,705,917 | 11/1987 | Gates, Jr. et al. | 361/414 |
| 4,746,855 | 5/1988 | Wrinn | 324/158 F |
| 4,799,128 | 1/1989 | Chen | 361/414 |
| 4,857,833 | 8/1989 | Gonzalez et al. | 324/73 PC |
| 4,928,061 | 5/1990 | Dampier et al. | 324/158 F |

Primary Examiner—Kenneth A. Wieder
Assistant Examiner—Vinh P. Nguyen
Attorney, Agent, or Firm—Townsend and Townsend

[57] ABSTRACT

A multilayer IC board is provided with channel plates on its surface for electrically coupling selected drivers and receivers of the ATE to selected electrical contacts of an IC being tested. This is accomplished by first electrically coupling some channel plates to the ATE drivers and receivers and other channel plates to the IC electrical contacts. Selected channel plates are then selectively electrically coupled together thereby coupling selected ATE drivers and receivers to selected IC electrical contacts. This provides for a large number of ATE to IC communication channel combinations that can be easily modified. A multilayer IC board is also provided with a lattice of noise reduction plates on its surface for reducing noise on the power channels to the IC being tested. This is accomplished by first electrically coupling the noise reduction plates to the power channels such that adjacent noise reduction plates are electrically coupled to power channels with different voltage levels. Capacitors are then electrically coupled between adjacent noise reduction plates of the lattice thereby reducing noise on selected power channels. The lattice arrangement of the noise reduction plates allows easy modification of the location of capacitors, especially when the power channels may be modified by the use of the channel plates.

27 Claims, 7 Drawing Sheets

MODIFIABLE IC BOARD

BACKGROUND OF THE INVENTION

This invention relates generally to equipment used for testing integrated circuits, and more particularly, to a modifiable board for holding integrated circuits having a variety of pin layouts during testing of the integrated circuits.

Integrated circuits (ICs) are tested before sale to ensure that the ICs function as designed. This testing is generally performed by automatic test equipment (ATE). The ATE is a programmable device that supplies power through multiple power channels, sends input signals through multiple input/output (I/O) channels to an IC, and reads the resulting output signals from the IC through the same I/O channels. The ATE then compares the IC output signals with expected output signals and fails the IC if the signals do not match or are otherwise improper. In addition, during these tests, ATEs can grade ICs as to performance (e.g., speed, etc.).

Figure 1:
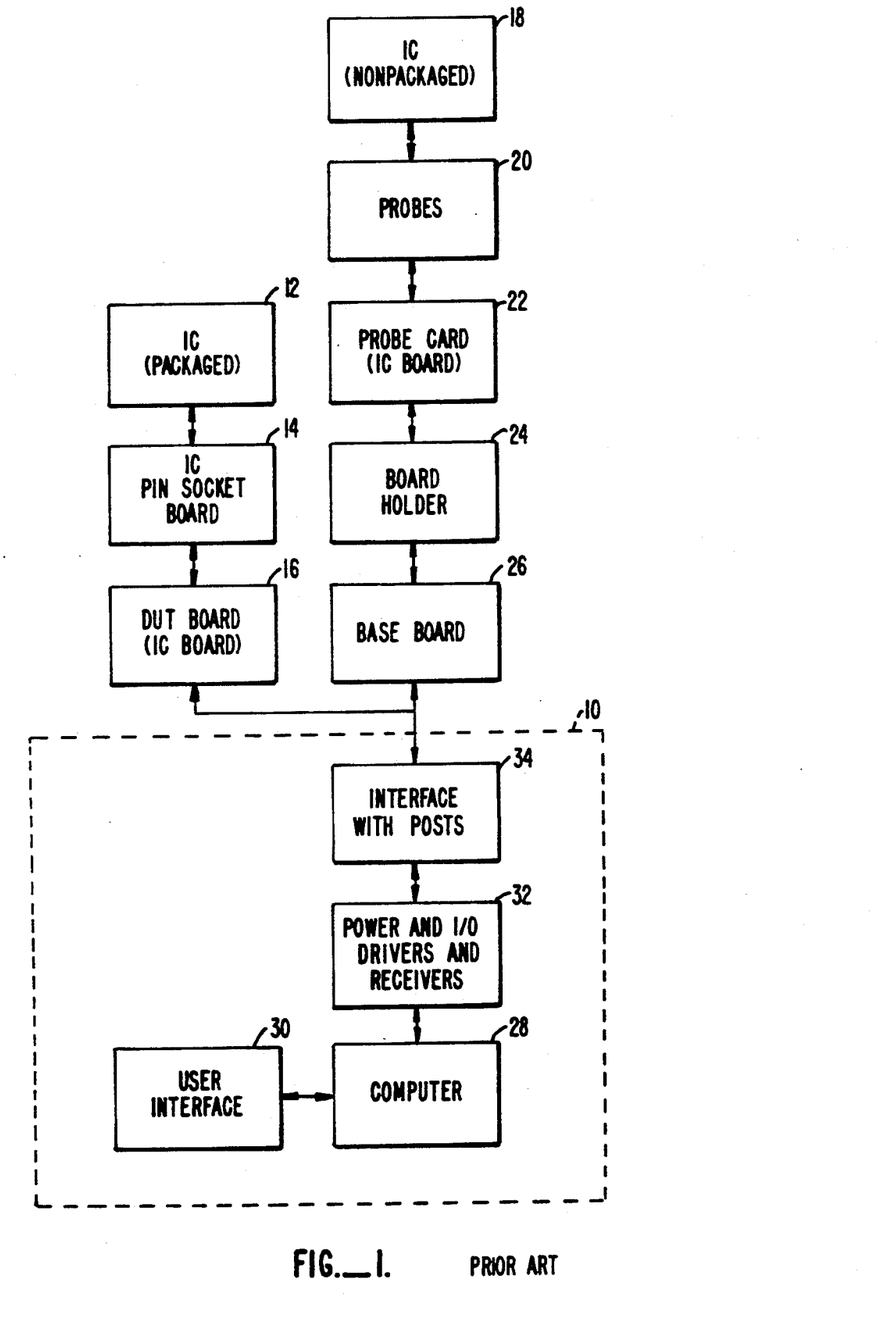
FIG. 1 is a block diagram of an IC coupled to an ATE for testing.

FIG. 1 is a block diagram of an IC electrically coupled to an ATE 10 for testing of the IC. A packaged IC 12 is typically electrically coupled to the ATE through an IC pin socket board 14 and a DUT board 16 (also known as an IC board). A non-packaged or wafer IC 18 is typically electrically coupled to the ATE through probes 20, a probe card 22 (also known as an IC board), a board holder 24 and a base board 26. A load board for providing variable resistance loads may also be located between the ATE and the DUT board or base board for older or less sophisticated ATE's.

The ATE includes a computer 28 which runs a test program for testing the IC. The test program, typically stored on well-known media, is selected by a user through a user interface 30 which usually includes a keyboard and display. The computer then controls various power and I/O drivers and receivers 32. The power drivers are programmed to continuously generate the desired high current voltage levels such as a TTL 5.0 voltage level or an ECL −2.0 voltage level. The I/O circuitry generates and reads current and/or voltage signals of a desired duration or level as required and supplied by the IC. The power and I/O drivers and receivers communicate externally through an interface 34 having many electrically conductive posts.

An example of an ATE is a Sentry 50 that is sold by Schlumberger. The Sentry 50 has six power supplies DPSO, DPS1, ..., DPS5. Each power supply has three poles called regulated force, sense, and return. The force pole provides a voltage or current of a desired level. The return pole provides a common system ground. The sense pole is used for regulation of the force and return poles. The Sentry 50 also includes I/O circuitry that can generate and read multiple I/O pulses. The Sentry 50 communicates externally with an interface having numerous posts arranged in a square (other ATEs arrange posts in a circular pattern). Each power driver pole has several redundant posts t provide parallel channels for the high currents, while the remaining posts are for the I/O channel communications.

The ATE communicates to the IC being tested through an IC board. The IC board is tailored to the IC being tested for providing power and I/O channels from the ATE to the IC. Typically, there are two types of IC boards, a probe card with probes for testing ICs before packaging and a device under test (DUT) board with an IC pin socket for testing ICs after packaging. The IC board may also include capacitors between power channels to reduce noise thereby increasing the reliability of the IC testing process.

Figure 2A:
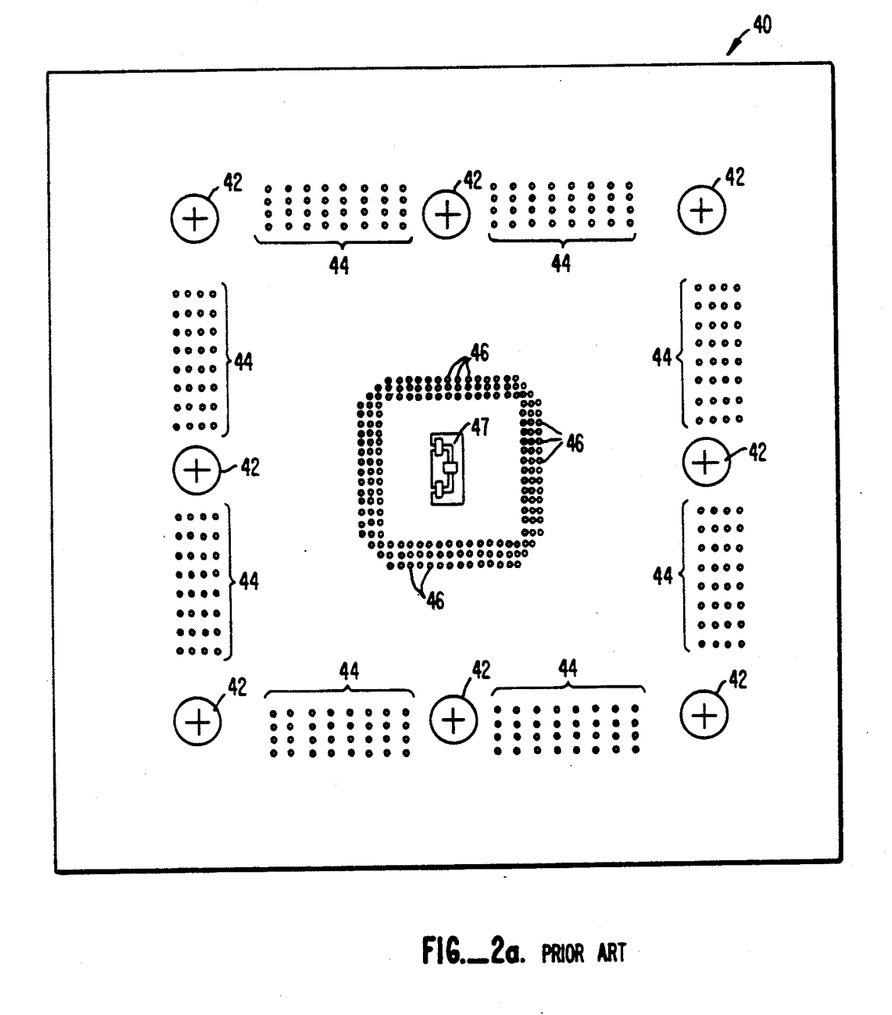
FIG. 2a is a drawing of an upper surface of a typical DUT board.

FIG. 2a shows an upper surface of a typical multilayer DUT board 40 suitable for use with the Schlumberger Sentry 50. The lower surface of the DUT board may also be similarly patterned. The DUT board includes eight fastening screws 42 for attaching it to the ATE. The DUT board also has multiple outer vias 44 which extend through the DUT board. A via is produced by forming a hole through the DUT board and lining the interior surface and lips of the hole with an electrically conductive material such as copper or aluminum. Each outer via matches one of the posts of the ATE thereby providing an electrical contact with the power and I/O channels. Each via also provides electrical communication to at least one of the layers of the DUT board as will be shown in FIG. 2b.

Also shown are inner vias 46 suitable for inserting an IC pin socket board onto the DUT board. The IC pin socket board provides a means for attaching packaged ICs to the DUT board. Each inner via 46 communicates to at least one of the layers of the DUT board. As a result, each one of the pins of an IC being tested communicates to the ATE through a power or I/O channel including the combination of the IC pin socket board, an inner via 46, a layer of the DUT board, an outer via 44, and an ATE post.

Custom designed noise reduction plates 47 may be located in the center of the DUT board. Plates 47 have small vias 48 for electrical communication with selected power channels. Leadless capacitors are known to be placed between the noise reduction plates to reduce noise on the power channels.

Figure 2B:
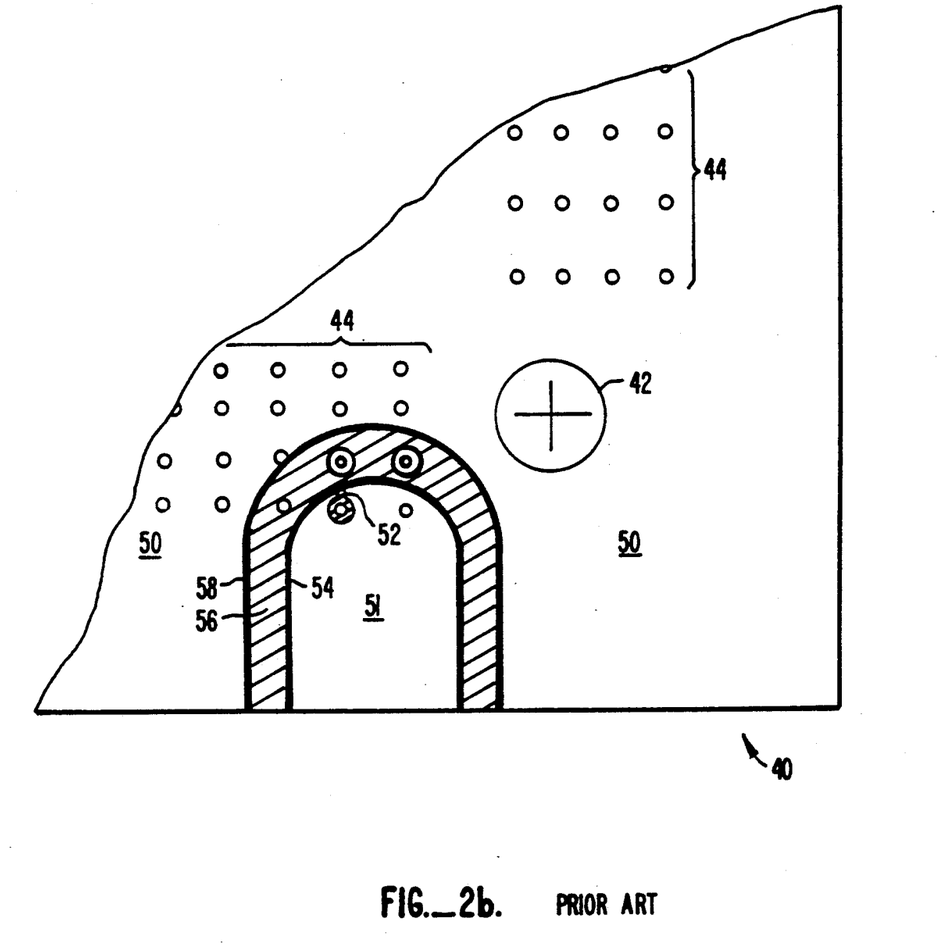

FIG. 2b is a cut-away view of the multilayered IC board of FIG. 2a. An upper surface 50 is shown with screw 42 and outer vias 44. The lowest level of the DUT board 51 is shown with one of the vias in electrical communication with electrically conductive line 52 which runs to an inner via for electrical communication to the IC pins. Lower level 51 is covered with an insulating dielectric 54 such as plastic. Above dielectric 54 is an electrically conductive layer 56 such as copper or aluminum plating which is shown in communication with one of the vias. As before, copper layer 56 is covered with more dielectric and conductive layers 58 extending upward to upper surface 50.

As a result of the multiple layers and the method of communication with the layers using the inner and outer vias, each of the outer vias is able to communicate with a pin or electrical pad of an IC being tested.

Figure 3:
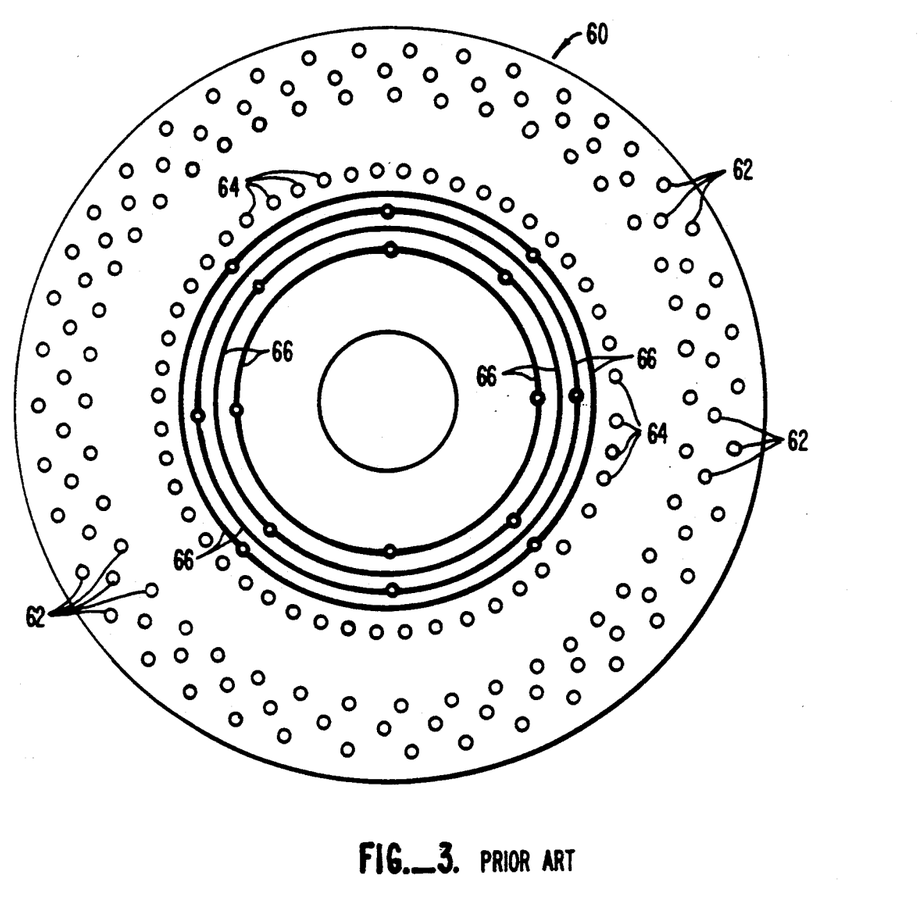
FIG. 3 is a drawing of an upper surface of a typical probe card.

FIG. 3 shows an upper surface of a typical multilayer probe card 60. The probe card includes multiple outer vias 62 for providing an electrical connection to the ATE through the board holder and base board. Also shown are inner vias 64 suitable for inserting probes onto the probe card. The probes provide a means for an electrical connection to various electrical pads of a non-packaged IC. Some probe cards are known to have concentric power rings 66 that are electrically connected to the power channels. Leadless capacitors may be placed between the concentric rings to provide noise reduction in the power channels.

New IC boards are designed and built for each type of IC to be tested due to the variety of IC pin or electrical pad layouts and the passive role of the IC board.

This, however, is costly when testing application specific integrated circuits (ASICs) due to the low volume of ICs produced for each type of ASIC.

SUMMARY OF THE INVENTION

The present invention provides a multilayer IC board with channel plates on its surface for electrically coupling selected drivers and receivers of the ATE to selected electrical contacts of an IC being tested. This is accomplished by first electrically coupling some channel plates to the ATE drivers and receivers and other channel plates to the IC electrical contacts. Selected channel plates are then selectively electrically coupled together thereby coupling selected ATE drivers and receivers to selected IC electrical contacts. This provides for a large number of ATE to IC communication channel combinations that can be easily modified.

The present invention also provides a multilayer IC board with a lattice of noise reduction plates on its surface for reducing noise on the power channels to the IC being tested. This is accomplished by first electrically coupling the noise reduction plates to the power channels such that adjacent noise reduction plates are electrically coupled to power channels with different voltage levels. Capacitors are then electrically coupled between adjacent noise reduction plates of the lattice thereby reducing noise on selected power channels. The lattice arrangement of the noise reduction plates allows for easy modification of the location of capacitors, especially when the power channels may be modified by the use of the channel plates.

A further understanding of the nature and advantages of the invention may be realized by reference to the remaining portions of the specification and the attached drawings.

BRIEF DESCRIPTION OF THE DRAWINGS

FIG. 2b is a cut-away drawing of the DUT board shown in FIG. 2a.

DESCRIPTION OF THE PREFERRED EMBODIMENTS

Figure 4:
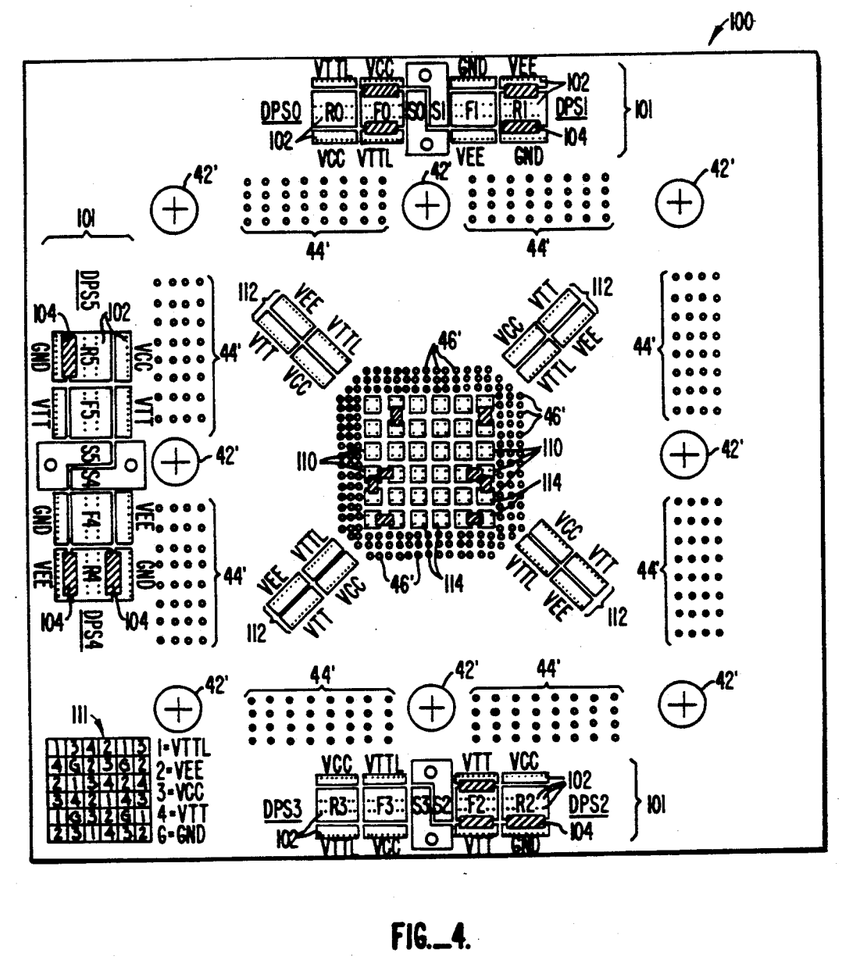
FIG. 4 is a drawing of an upper surface of preferred DUT board.

FIG. 4 shows an upper surface of a preferred multilayer DUT board 100 suitable for use with the Schlumberger Sentry 50 ATE. The lower surface of the DUT board may be similarly patterned.

The power and I/O channels from the ATE to the IC pins may include channel plates 101, channel plate vias 102, and conductor straps 104 located on the upper surface of the DUT board. The channel plates allow selection of which drivers and receivers from the ATE connect to the pins of an IC being tested. Each channel plate is separated laterally from the other channel plates by about 0.015 inches. Each channel plate contains vias 102 for communication with at least one of the layers of the IC board. In this embodiment, plates F0-F6, R0-R6 and S0-S6 communicate with the ATE power drivers through the conductive layers and outer vias 44', whereas channel plates VTTL, VEE, VCC, VTT, GND communicate with the IC pins through the conductive layers, inner vias 46', and pin sockets of a IC pin socket board. Conductor straps 104 are electrically connected between the channel plates to provide the desired power channels between channel plates communicating to the ATE and channel plates communicating to pins of the IC being tested. Braided coaxial cables are preferred as conductor straps because they do not add parasitic inductance to the power channels. Multiple channel plates and conductor straps may be used to provide parallel paths for high currents.

In this embodiment, noise reduction plates 110 are located in the center of the DUT board in a rectangular grid pattern, directly below the pin socket board. For ease of use, the pattern is described in a legend 111. Additional noise reduction plates 112 are located just outside inner vias 46. Each noise reduction plate has small vias 114 for establishing electrical communication with various layers within the IC board. It is generally preferred that the noise reduction plates communicate only with IC board layers that communicate with IC power pins.

The noise reduction plates are arranged in a lattice such as a rectangular grid or hexagonal array to permit an increase in the number of contiguous noise reduction plates. In addition, the noise reduction plates are arranged so that each noise reduction plate is next to noise reduction plates of different voltage levels. Noise reducing capacitors 66 such as well known leadless capacitors are then placed across adjacent noise reduction plates with the different voltage levels. The capacitors reduce the noise in the power channels caused by the ATE, the IC board, and other external sources. The noise reduction plates are located directly below the IC pin socket board in order to minimize the distance between the noise reducing capacitors and the IC being tested, thereby maximizing the effect of the capacitors. The noise reduction plates are arranged as described above to increase the number of possible combinations of contiguous noise reduction plates with different voltage levels. This arrangement also increases the number of duplicate combinations of noise reduction plates. This allows the IC board to be easily modified to meet the needs of the type of IC being tested or to adapt to a change in ATE power drivers being used.

The configuration of the channel plate connections shown in FIG. 4 is an ECL/TTL single rail power source. The conductive straps are arranged in combination with the ATE such that F0 sets VCC = VTTL = +5.0V, F2 sets VTT = +3.0V, and R1, R2, R4, and R5 set VEE=GND=0.0V.

Figure 5A:
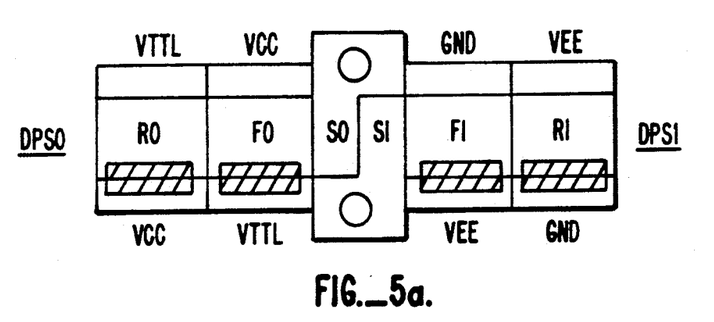
FIGS. 5a, 5b, and 5c are drawings of alternative channel plate connections.
Figure 5B:
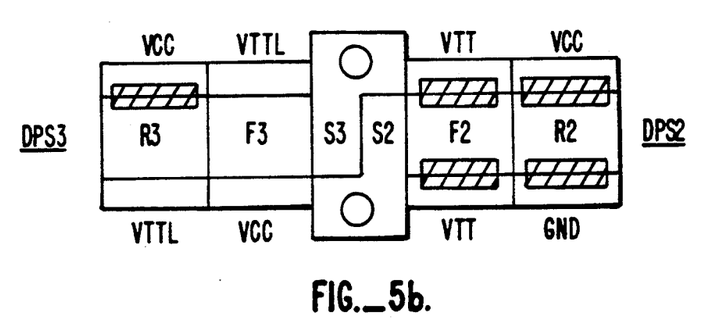
Figure 5C:
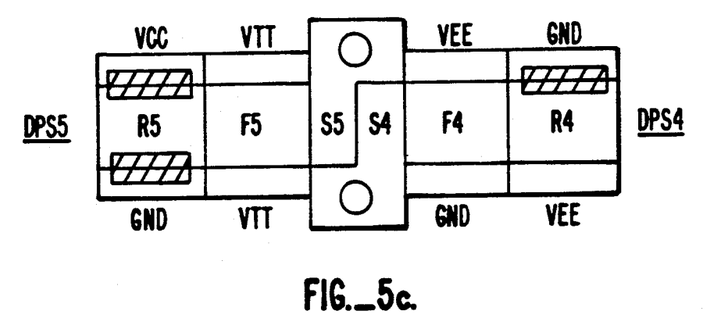

FIGS. 5a, 5b, and 5c show the channel plate connections reconfigured in combination with the ATE to an ECL/TTL dual rail power source. In this configuration, F0 sets VTTL= +5.0 V, F1 sets VEE= −4.5 V, F2 sets VTT= −2.0V, and R0, R1, R3, R3, R4, and R5 set VCC=GND=0.0V. Other configurations may be had by merely modifying the configuration of the channel plate connections.

Figure 6:
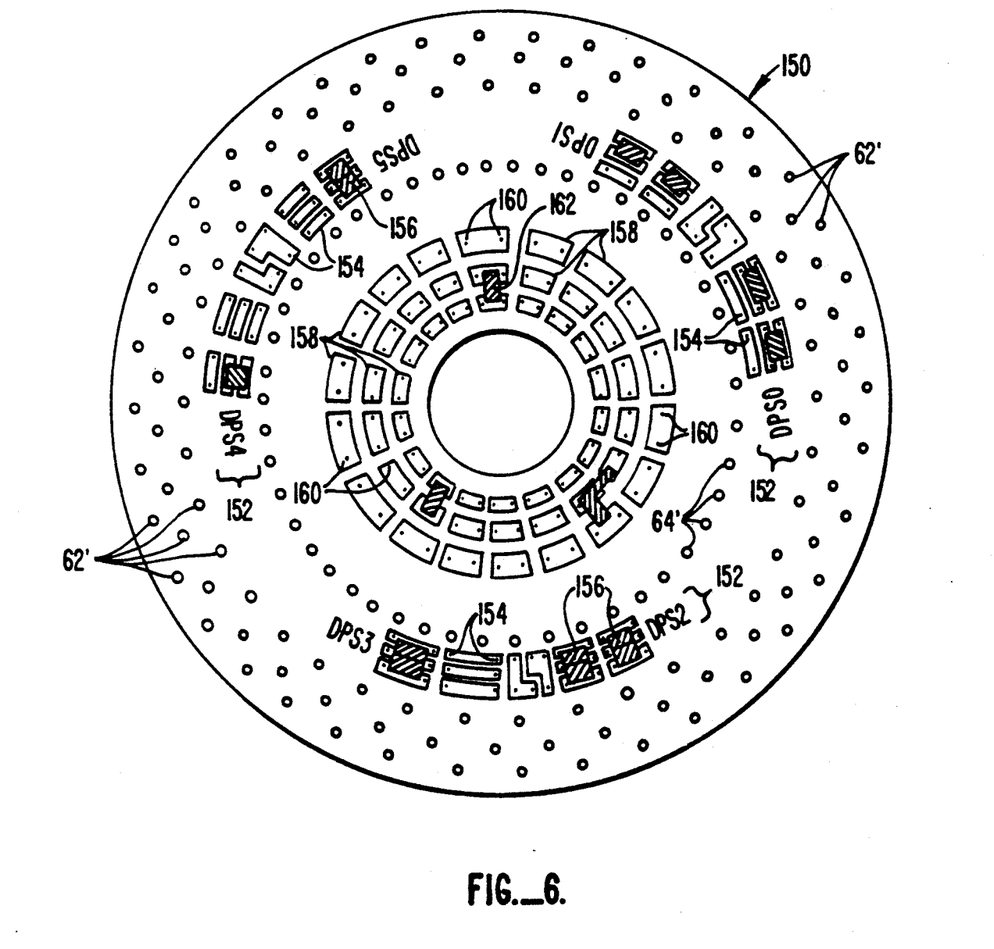
FIG. 6 is a drawing at an upper surface of a preferred probe card.

FIG. 6 shows an upper surface of a preferred multilayer probe card 150. The lower surface of the probe card may be similarly patterned. As in the prior art probe card of FIG. 3, this embodiment of the invention has outer vias 62' for providing an electrical connection to the ATE and inner vias 64' suitable for inserting probes. However, this embodiment differs in having channel plates and noise reduction plates.

The power and I/O channels from the ATE to the IC pads may include channel plates 152, channel plate vias 154, and conductor straps 156. As with the DUT board, the channel plates allow selection of which ATE drivers and receivers connect to the electrical pads of the IC being tested.

Noise reduction plates 158 are located near the center of the probe card in a concentric grid pattern. Other lattice patterns such as sets of rectangular grids may also be used. Each noise reduction plate has small vias 160 for establishing electrical communication with selected power channels. Capacitors 162 such as leadless capacitors may be placed between noise reduction plates to reduce noise on the power channels. As with the DUT board, the noise reduction plates are arranged in a lattice pattern with adjacent plates having different voltage levels to permit an increase in the number of contiguous noise reduction plates.

While the above is a complete description of specific embodiments of the invention, various modifications, alternative constructions, and equivalents may be used. For example, a greater number of power plates or noise reduction on the upper or lower surfaces may be used. In addition, the use of channel plates and conductor straps could also be applied to I/O channels. Therefore, the above description and illustrations should not be taken as limiting the scope of the present invention, which is defined by the appended claims.

What is claimed is:

1. An IC board for providing electrical coupling in a plurality of channels from test equipment to an integrated circuit, the test equipment having power and I/O drivers and receivers, the integrated circuit having power and I/O electrical contacts, the IC board comprising:
   a) first means for providing electrical communication from selected power and I/O drivers and receivers to selected first channels;
   b) second means for providing electrical communication from selected power and I/O electrical contacts to selected second channels, said second means comprising:
      1) first channel plates located on a surface of the IC board;
      2) first channel vias located within the first channel plates for providing electrical communication from the first channel plates to selected first channels;
      3) second channel plates located on the surface of the IC board; and
      4) second channel vias located within the second channel plates for providing electrical communication from the second channel plates to selected second channels; and
   c) third means for selectively providing electrical communication from selected first channels to selected second channels, thereby providing electrical communication from selected test equipment power and I/O drivers and receivers to selected integrated circuit power and I/O electrical contacts.

2. The IC board of claim 1 whenever the first and third means each comprise a plurality of vias.

3. The IC board of claim 1 wherein the second means further comprises a fourth means for providing electrical communication from selected first channel plates to selected second channel plates.

4. The IC board of claim 3 wherein the fourth means comprisers braided coaxial cable.

5. An IC board for providing electrical coupling in a plurality of power and I/O channels from test equipment to an integrated circuit, the test equipment having power and I/O drivers and receivers, the integrated circuit having power and I/O electrical contacts, the IC board comprising:
   a) first means for providing electrical communication from test equipment power and I/O drivers and receivers to selected power and I/O channels;
   b) second means for providing electrical communication from integrated circuit power and I/O electrical contacts to selected power and I/O channels, said second means comprising:
      1) first channel plates located on a surface of the IC board;
      2) first channel vias located within the first channel plates for providing electrical communication from the first channel plates to selected first channels;
      3) second channel plates located on the surface of the IC board; and
      4) second channel vias located within the second channel plates for providing electrical communication from the second channel plates to selected second channels; and
   (c) noise reduction plates located on the surface of the IC board;
   d) third means for providing electrical communication from the noise reduction plates to selected power channels.

6. The IC board of claim 5 wherein the first, second, and third means each comprise a plurality of vias.

7. The IC board of claim 5 wherein the noise reduction plates are located in the center of the IC board.

8. The IC board of claim 5 further comprising capacitors placed between selected noise reduction plates for reducing noise on selected power channels.

9. The IC board of claim 8 wherein the capacitors are leadless capacitors.

10. A DUT board for providing electrical coupling in a plurality of channels from test equipment to an integrated circuit, the test equipment having power and I/O drivers and receivers, the integrated circuit having power and I/O electrical contacts, the DUT board comprising:
   a) first means for providing electrical communication from selected power and I/O drivers and receivers to selected first channels;
   b) second means for providing electrical communication from selected power and I/O electrical contacts to selected second channel, said second means comprising:
      1) first channel plates located on the surface of the DUT board;
      2) first channel vias located within the first channel plates for providing electrical communication from the first channel plates to selected first channels;
      3) second channel plates located on the surface of the DUT board; and
      4) second channel vias located within the second channel plates for providing electrical communication from the second channel plates to selected second channels; and
   c) third means for selectively providing electrical communication from selected first channel to selected second channels, thereby providing electrical communication from selected test equipment power and I/O drivers and receivers to selected integrated circuit power and I/O electrical contacts.

11. The DUT board of claim 10 wherein the first and third means each comprise a plurality of vias.

12. The DUT board of claim 10 wherein the second means further comprises a fourth means for providing electrical communication from selected first channel plates to selected second channel plates.

13. The DUT board of claim 12 wherein the fourth means comprises braided coaxial cable.

14. An DUT board for providing electrical coupling in a plurality of power and I/O channels from test equipment to an integrated circuit, the test equipment having power and I/O drivers and receivers, the integrated circuit having power and I/O electrical contacts, the DUT board comprising:
   a) first means for providing electrical communication from test equipment power and I/O drivers and receivers to selected power and I/O channels;
   b) second means for providing electrical communication from integrated circuit power and I/O electrical contacts to selected power and I/O channels, said second means comprising:
      1) first channel plates located on a surface of the IC board;
      2) first channel vias located within the first channel plates for providing electrical communication from the first channel plates to selected first channels;
      3) second channel plates located on the surface of the IC board; and
      4) second channel vias located within the second channel plates for providing electrical communication from the second channel plates to selected second channels.
   c) noise reduction plates located on the surface of the DUT board; and
   d) third means for providing electrical communication from the noise reduction plates to selected power channels.

15. The DUT board of claim 14 wherein the first, second, and third means each comprises a plurality of vias.

16. The DUT board of claim 14 wherein the noise reduction plates are located in the center of the DUT board.

17. The DUT board of claim 14 further comprising capacitors placed between selected noise reduction plates for reducing noise on selected power channels.

18. The DUT board of claim 17 wherein the capacitors are leadless capacitors.

19. A probe card for providing electrical coupling in a plurality of channels from test equipment to an integrated circuit, the test equipment having power and I/O drivers and receivers, the integrated circuit having power and I/O electrical contacts, the probe card comprising:
   a) first means for providing electrical communication from selected power and I/O drivers and receivers to selected first channels;
   b) second means for providing electrical communication from selected power and I/O electrical contacts to selected second channels, said second means comprises:
      1) first channel plates located on a surface of the probe card;
      2) first channel vias located within the first channel plates for providing electrical communication from the first channel plates to selected first channels;
      3) second channel plates located on the surface of the probe card; and
      4) second channel vias located within the second channel plates for providing electrical communication from the second channel plates to selected second channels; and
   c) third means for selectively providing electrical communication from selected first channels to selected second channels, thereby providing electrical communication from selected test equipment power and I/O drivers and receivers to selected integrated circuit power and I/O electrical contacts.

20. The probe card of claim 19 wherein the first and third means comprise a plurality of vias.

21. The probe card of claim 19 wherein the second means further comprises a fourth means for providing electrical communication from selected first channel plates to selected second channel plates.

22. The probe card of claim 21 wherein the fourth means comprises braided coaxial cable.

23. A probe card for providing electrical coupling in a plurality of power and I/O channels from test equipment to an integrated circuit, the test equipment having power and I/O drivers and receivers, the integrated circuit having power and I/O electrical contacts, the probe card comprising:
   a) first means for providing electrical communication from test equipment power and I/O drivers and receivers to selected power and I/O channels;
   b) second means for providing electrical communication from integrated circuit power and I/O electrical contacts to selected power and I/O channels, said second means comprising:
      1) first channel plates located on a surface of the probe card;
      2) first channel vias located within the first channel plates for providing electrical communication from the first channel plates to selected first channels;
      3) second channel plates located on the surface of the probe card; and
      4) second channel vias located within the second channel plates for providing electrical communication from the second channel plates to selected second channels;
   c) noise reduction plates located on the surface of the probe card; and
   d) third means for providing electrical communication from the noise reduction plates to selected power channels.

24. The probe card of claim 23 wherein the first, second, and third means are comprised of a plurality of vias.

25. The probe card of claim 23 wherein the noise reduction plates are located in the center of the probe card.

26. The probe card of claim 23 further comprising capacitors placed between selected noise reduction plates for reducing noise on selected power channels.

27. The probe card of claim 26 wherein the capacitors are leadless capacitors.

* * * * *